United States Patent [19]

Taylor

[11] Patent Number: 4,628,598
[45] Date of Patent: Dec. 16, 1986

[54] MECHANICAL LOCKING BETWEEN MULTI-LAYER PRINTED WIRING BOARD CONDUCTORS AND THROUGH-HOLE PLATING

[75] Inventor: Edward Taylor, Agoura Hills, Calif.

[73] Assignee: The United States of America as represented by the Secretary of the Air Force, Washington, D.C.

[21] Appl. No.: 657,097

[22] Filed: Oct. 2, 1984

[51] Int. Cl.⁴ .......................... H05K 3/42; H05K 3/46
[52] U.S. Cl. ........................................ 29/846; 29/847; 29/852; 156/153; 174/68.5; 264/139; 264/156; 264/273; 361/414
[58] Field of Search ...................... 174/68.5; 361/414; 156/153, 154; 29/831, 852, 853, 846, 847; 264/138, 139, 273, 274

[56] References Cited

U.S. PATENT DOCUMENTS

| | | | |
|---|---|---|---|
| 2,872,391 | 2/1959 | Hauser | 361/414 X |
| 3,264,402 | 8/1966 | Shaheen et al. | 174/68.5 |
| 3,301,939 | 1/1968 | Krasnow | 174/68.5 |
| 3,411,204 | 11/1968 | Reid | 361/414 X |
| 3,471,631 | 10/1969 | Quintama | 361/414 X |
| 3,627,902 | 12/1971 | Meyres et al. | 156/150 X |
| 3,660,726 | 5/1972 | Ammon et al. | 361/414 X |
| 3,809,591 | 5/1974 | Vogelfanger et al. | 156/153 X |
| 4,012,307 | 3/1977 | Phillips | 29/852 X |
| 4,091,125 | 5/1978 | Delgadillo | 156/153 X |
| 4,354,895 | 10/1982 | Ellis | 174/68.5 X |

Primary Examiner—R. R. Kucia
Attorney, Agent, or Firm—Donald J. Singer; Gerald B. Hollins

[57] ABSTRACT

A plated through-hole conductor structure for a multiple layer laminate electronic printed wiring board includes mechanical locking of the plated through conductor with textured conductor surfaces together with use of etching or other processing to provide laminate internal space for the mechanical locking structure. A manufacturing sequence and plural material selections are also disclosed.

2 Claims, 3 Drawing Figures

MECHANICAL LOCKING BETWEEN MULTI-LAYER PRINTED WIRING BOARD CONDUCTORS AND THROUGH-HOLE PLATING

RIGHTS OF THE GOVERNMENT

The invention described herein may be manufactured and used by or for the Government of the United States for all governmental purposes without the payment of any royalty.

BACKGROUND OF THE INVENTION

This invention relates to the field of electrical printed wiring board structure and to the manufacture of such boards.

Wide acceptance of the printed wiring board as a suitable mechanical carrier and electrical connector for electronic and small electro-mechanical components is evidenced by the use of these boards in most modern-day electronic systems, including computers, television and consumer electronics, military and industrial equipment. Although this wide utilization attests to a major degree of satisfaction with the performance of these boards in a variety of environmental conditions, certain problems occur frequently in complex multilayer printed wiring boards, particularly where these boards are subjected to extreme environmental stresses such as wide operating temperature range and wide frequency band mechanical vibration. Environments of this type are of course frequently found in military equipment such as aircraft where typically the change from tropical conditions and mechanical quiescence to sub-Arctic high-vibration conditions can occur within a few minutes.

An area of frequent concern in such high-stress environments is the printed wiring board arrangement for through-hole conductors which are used in the locations where electronic components are mounted on the printed wiring board or where conductors residing in a plurality of printed wiring board layers are electrically joined together or where edge connectors or other off-board electrical connections are made to the printed wiring board conductors. The through-hole conductor structure has been a frequent source of intermittent electrical connection, electrical heat generation, chemical corrosion activity and other failure mechanisms. Through-hole conductor problems exist to a degree requiring significant expenditure of extra fabrication, testing and maintenance effort as preventative assurance against expensive in-field equipment failures. In the earlier days of the electronic digital computer, for example, it was common manufacturing practice to hand-solder the printed wiring board areas attending a multilayer through-hole conductor, on each side of the board, following a normal dipping or wave soldering manufacturing procedure. Dipping or wave soldering was alone sufficient for other connections on a printed wiring board, but not adequate to assure reliable long life through-hole conductors. This special and elaborate manual attention to a through-hole conductor is clearly undesirable from the viewpoints of printed wiring board cost, reliability, appearance, and from the possibility of damaging other components located nearby on a crowded printed wiring board.

The prior patent art discloses inventive attention to the printed wiring board in general and includes the patent of R. F. Jack et al, U.S. Pat. No. 3,075,280, which depicts a method of interlocking between the insulating base and the metal surface of a printed wiring board. In the Jack patent, this interlocking method requires that metal particles be compressed and heated within the grooves of a forming die to fabricate the printed wiring board conductors.

The patent of K. H. Phol, U.S. Pat. No. 3,628,243, discloses a method for forming an isolated conductive path on a laminate by mechanically displacing portions of a conductor sheet to a locus within the wiring board cross section and out of possible connection with the remainder of the conductor material.

Generally, none of the prior art configurations provide a printed wiring board through-hole conductor arrangement that is satisfactory from all of the pertinent viewpoints.

SUMMARY OF THE INVENTION

An object of the present invention is to provide a printed wiring board through-hole conductor structure which is resistant to the effects of temperature change and vibration.

Another object of the invention is to provide a method for fabricating an improved through-hole conductor structure.

Another object of the invention is to provide a printed wiring board through-hole structure which can employ similar metals in the ribbon and through-hole structures.

Yet another object of the invention is to provide a printed wiring board through-hole structure which realizes the advantages of close conductor conformity resulting from electroplate or other depositing of conductors.

These and other objects of the invention are achieved by the method of forming multiple conducting layer printed circuit wiring boards including the steps of roughening the surfaces of the wiring board layer conductors in at least the intended regions of conductor interconnection, assembling the roughened surfaces conductors into an alternating sequence conductor layer and insulating layer laminate structure, drilling holes through the laminate structure at the roughened surface interconnection locations thereof, enlarging the diameter of the holes in the insulating layer depth regions of the laminate structure until regions of exposed roughened surface area conductor opening into the holes are formed, and filling the holes in the enlarged diameter regions by depositing therein additional conductor material having interlocking engagement continuity with the regions of roughened conductor.

DETAILED DESCRIPTION

Figure 1:
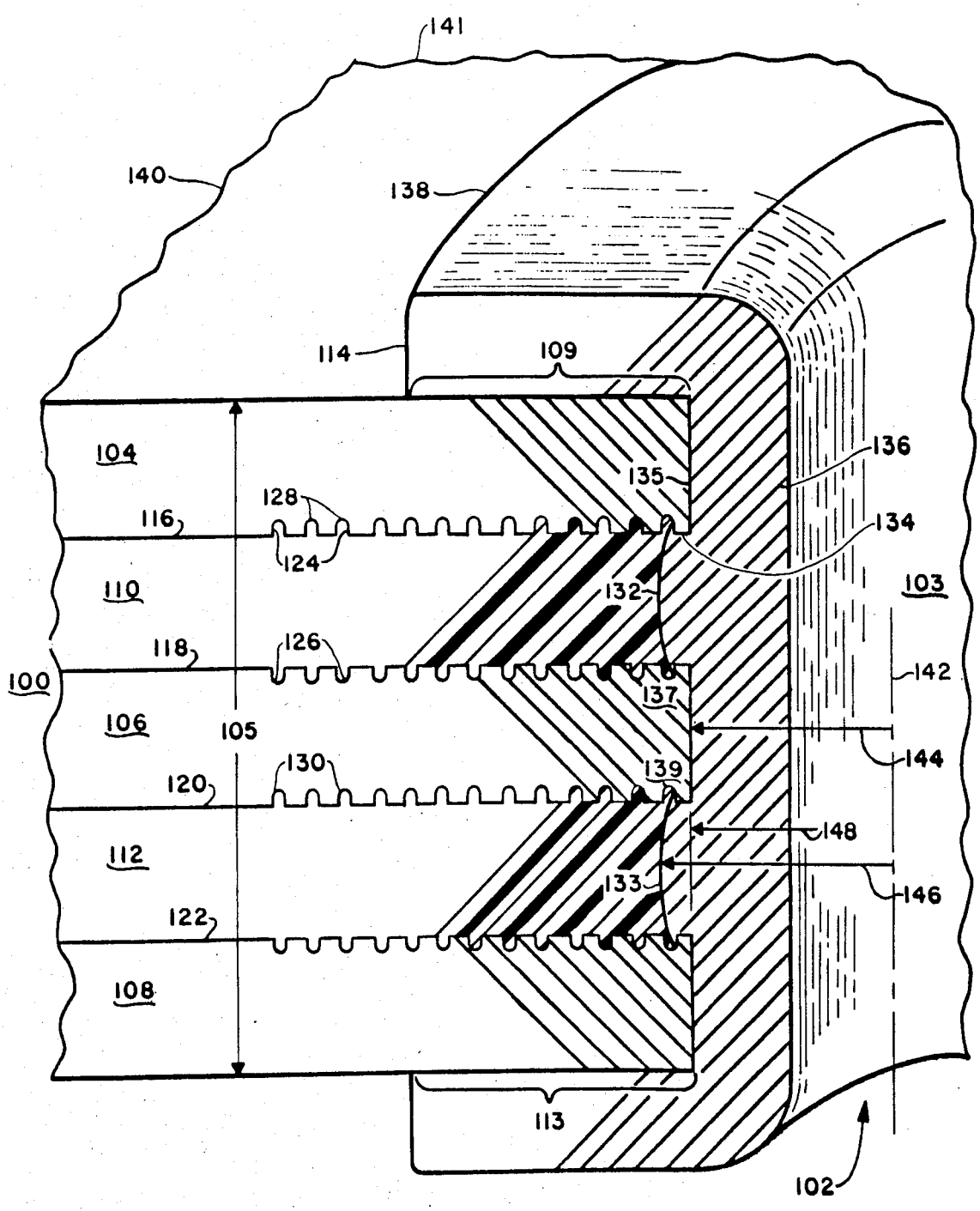
FIG. 1 is a cross-sectional view of one arrangement of an improved through-hole conductor structure.

FIG. 1 of the drawings shows an enlarged cross-sectional view of a printed wiring board 100 in the region of a through-hole conductor 102 such as might be employed for electronic component mounting, layer conductor interconnection, and wiring board terminal mounting. In the FIG. 1 representation, the through-hole conductor 102 is shown to be empty and unoccupied by any of these possible received elements and the wiring board 100 is shown to be of the three conductor laminate type having intervening layers of insulating material between the three conductor layers. The FIG. 1 printed wiring board is shown to include conductors 104, 106 and 108, which may be made of a metal foil such as copper or a silver alloy. The FIG. 1 board employs an adhesive interface indicated at 116, 118, 120 and 122 between the metal foil conductors and the intervening insulating layers; these insulating layers may be fabricated from an organic resin material such as a phenolic or a fiberglass composition or from other organic materials which are known in the art. The electrical insulating materials 110 and 112 in FIG. 1 may also be inorganic in nature with certain modifications of the FIG. 1 arrangement.

The enlarged scale of the FIG. 1 drawing may be appreciated by realizing that the thickness measurement 105 of the illustrated printed wiring board is normally between 1/16 (0.065) and ⅛ (0.125) of an inch and that the through-hole perforation 102 is of similar diametrically in most instances. The abbreviated lateral extent of the FIG. 1 drawing is indicated by the cutting lines 140 and 141, the usual printed wiring board of course extends for several inches in each of two coordinate directions.

The three metal foil conductors 104, 106 and 108 in FIG. 1 are shown to be electrically connected by the through-hole conductor 103 which is shown to extend from a region of overlap 109 with the exterior upper surface of the conductor 104 through the laminated structure of the printed wiring board 100 to a second region of overlap with the exterior lower surface of the conductor 108 as shown at 113.

The through-hole conductor 103 in FIG. 1 is shown to have three contact surfaces with each of the metal foil conductors 104, 106, and 108, these three contact surfaces exist at 134, 135 and in the region of overlap 109 in the case of the metal foil conductor 104. In addition to these three contact surfaces, the through-hole conductor 103 is shown to be mechanically interlocked with one or more of the surfaces of the metal conductors in FIG. 1 as is indicated at the region 137 for the metal foil conductor 105. The nature and fabrication of this interlock region is described in detail below. The presence of the interlock regions 137 in the FIG. 1 through-hole conductor adds thermal stability and mechanical rigidity to the electrical path formed at the contact surfaces 134, 135, and 109. The concealed and protected location of these interlock regions moreover provides additional assurance that an achieved electrical connection at these three contact surfaces will be stable under adverse environmental conditions.

The formation of the interlock region 137 and the similar regions in the conductors 104 and 108 contemplates the presence of surface roughness or a texture condition such as might be provided by abrading, cutting, knurling, embossing or other mechanical operations on the surface of the metal conductors 104–108 or alternately the presence of roughness such as might be provided by a chemical reaction with acids, bases, oxidation, or reduction agents at the surface of the metal conductors either before or subsequent to fabrication of the printed wiring board 100.

According to the FIG. 1 embodiment, the interlock region 137 is fabricated when the through-hole conductor 103 is formed by a deposition process such as electroplating, the deposited material conforming to and filling the surface roughness voids 128 and 130 in the conductors 104 and 106 during the deposition process. As is also suggested in FIG. 1, the printed wiring board 100 may further employ the filling of the conductor surface roughness voids 128 by the insulating resin material 110 itself or by the adhesive used in joining the resin material to the metal foil conductor as an arrangement for holding the metal foil and the resin in permanent relationship. According to this use of the surface roughness voids 138, filling of conductor voids by the resin or adhesive material will occur as indicated at 124 and 126 for the conductors 104 and 106.

The arrangement of the surface roughness voids 128 and 130 is a matter of choice with respect to the pattern and void dimensions employed, a desirable selection being based upon the type of materials employed and fabrication convenience. A suitable arrangement for the voids may, for example, be in accordance with the FIG. 1 printed circuit board wherein the voids are of U-shaped cross-section and have depth and width each of at least one-tenth the conductor thickness. Regardless of the pattern and dimensions employed for the voids, the present invention contemplates the achievement of mechanical interlocking between the through-hole conductor 103 and the roughened or textured wiring board conductors 104, 106 and 108 in the regions adjacent the through-hole conductor structure.

To provide physical space for achieving the interlock regions 137 and 139 there is shown in FIG. 1 a pair of etchback or recess regions 132 and 133 wherein the insulating resin material 110 and 112 is absent in order that the deposited conductor metal 114 have access to the surface roughness voids of the conductors 104, 106 and 108 during the deposition process.

Figures 2, 3:
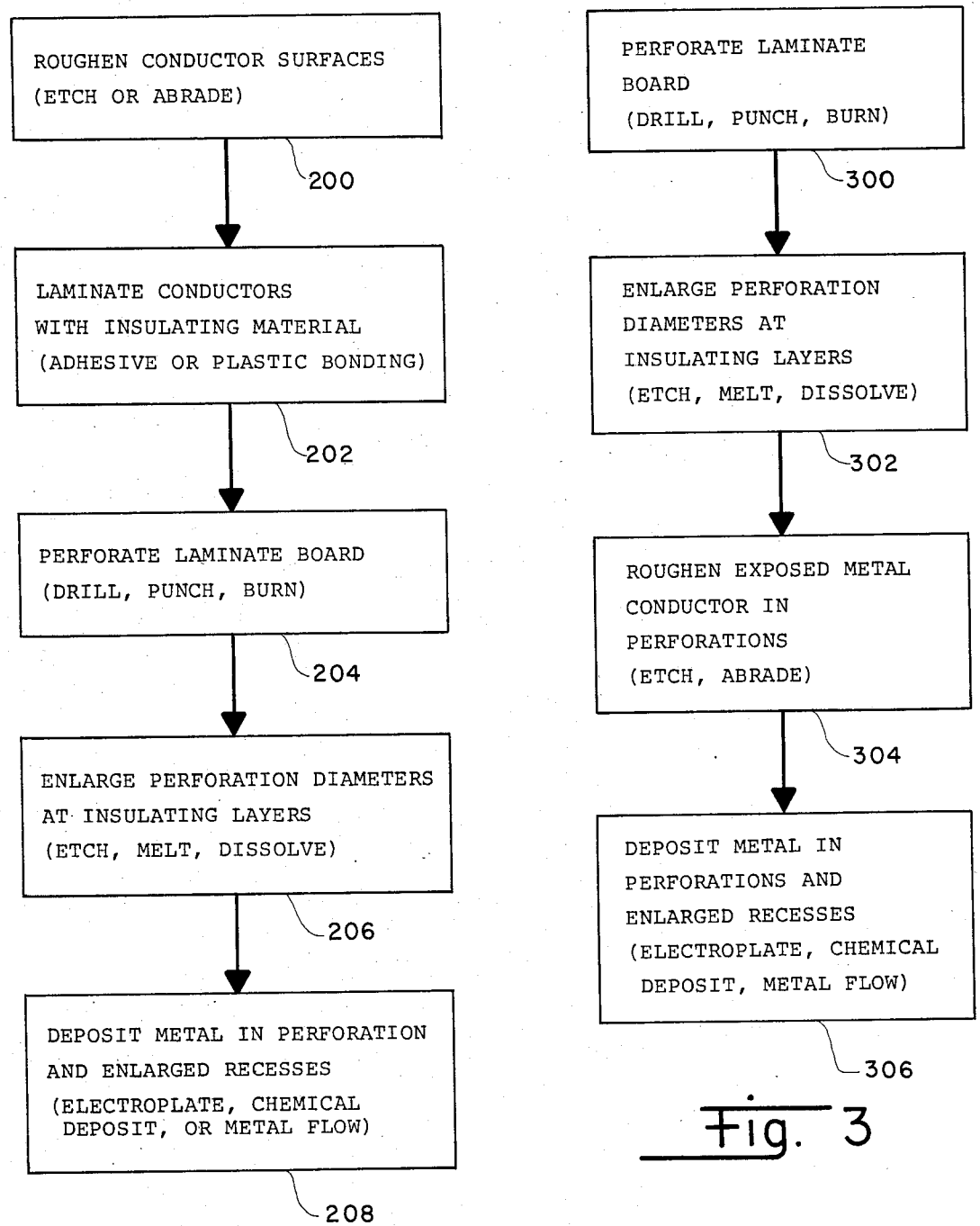
FIG. 2 is a flow diagram describing a manufacturing sequence for the improved through-hole conductor arrangement.
FIG. 3 is a flow diagram for an alternate manufacturing sequence for the improved through-hole conductor arrangement.

A preferred sequence for manufacturing the FIG. 1 printed wiring board including the recess regions 132 and 133 is shown in flow diagram form in FIG. 2 of the drawings; the FIG. 2 sequence includes steps which provide the surface roughness voids and the laminated printed wiring board structure in addition to providing the recess regions in the insulating resin material. The FIG. 2 sequence presumes the presence of the conductors 104, 106 and 108 in foil or sheet form and commences with roughening of the conductor surfaces by the above-indicated mechanical or chemical operations as indicated in the block 200. This roughening is followed by lamination of the conductors with intervening insulating material layers by way of adhesive attachment, plastic bonding, or a liquid phase insulation insertion step such as injection molding; all as indicated in the block 202. The parenthetic words in the lower line of the FIG. 2 blocks provide examples of the indicated step and are not to be considered limitations of the invention.

Once the laminate printed wiring board structure is achieved, space for the through-hole conductor 103 is provided by a step such as drilling, punching, or burning (with a laser beam for example), as indicated at 204 in FIG. 2. The term perforate used to describe this drilling, punching or burning step in FIG. 2 is intended to be a generic indication of many possible alternatives which are known in the art. Similarly each of the indicated forming words used in FIGS. 2 and 3 are intended to be broadly interpreted, since an exhaustive list of possible alternate steps would be lengthy and cumbersome.

Once drilled holes or other perforations exist in the printed wiring board structure, an enlargement of the hole diameter in the regions of the insulating resin material 110 and 112 is achieved. This enlargement can use chemical or plasma etching, melting, or chemical solvent dissolving of the resin material, as is indicated in the block 206, to form the recess regions 132 and 133. The radius of the through-hole perforation 102 both before and after the enlargement step 206 is indicated at 144 and 146 in FIG. 1; these radius indications are with respect to the through-hole center line 142.

A selection among the possible etching, melting, or chemical dissolving arrangements for forming the recess regions 132 and 133 depends of course upon the material used for the printed wiring board 100. Phenolic materials, as might be employed for the insulating material 110 and 112, classified are in the chemical literature as being susceptible to strong alkali compounds such as the metal hydroxides and also susceptible to the oxidizing acids. The effect of these reagents on the copper or other conductor metal must, of course, be considered since acids, for example, will react to a degree with most conductor metals. A conductor metal reaction, if carefully controlled could of course provide both the development of the recess region 132 and 133 and the surface roughening in a single manufacturing step. Additional reagents become plausible for forming the recess regions 132 and 133 if the formation is done prior to curing of the insulating material 110 and 112—wherein the case these materials are thermosetting in nature, since the thermoset curing reaction makes the material less susceptible to chemical dissolution.

Once the recess regions 132 and 133 are formed, the through-hole conductor 103 can be achieved by a deposition process indicated at 208 in FIG. 2 and preferably involving an electroplating, chemical deposition, or metal flow process as indicated in the parenthetic examples in block 208.

The FIG. 2 sequence is based on the provision of roughened conductor surfaces prior to fabrication of the printed wiring board 100. An alternate to this arrangement is suggested by the flow sequence of FIG. 3 wherein the roughened surface condition is achieved by chemical etching or abrading that is accomplished following perforation of the printed wiring board—as indicated by the blocks 304 and 300, respectively in FIG. 3. The FIG. 3 sequence also assumes enlargement of the printed wiring board perforation by chemical or plasma etching, melting, or chemical dissolving, as indicated at 302 and deposition of the through-hole conductor 103 as indicated in the block 306.

It should be realized, of course, that the described drilling of the perforation and the description of the perforation in terms of a radius dimension is not intended to limit the through-hole conductor 103 to a circular shape. Similarly, the perforation may have an alignment which is other than perpendicular to the lateral surface of the printed circuit board and the perforations may extend a distance less than completely through the printed wiring board laminate structure and yet be within contemplation of the invention. It should be understood therefore that the term perforation is intended to be generic to any cross-sectional shape such as, but not limited to, round, oval, square, hexagonal, ellipsoidal and to include any procedure for achieving passage into the wiring board laminate structure such as, but not limited to, drilling, punching, reaming, piercing, laser burning, boring, and grinding.

Although the invention has been described principally with respect to surface roughness voids being provided on the lateral surfaces of the conductors 104, 106 and 108, it should be realized that the sequence described in FIG. 3 wherein the roughening of the conductor surfaces is accomplished within the perforation cavity will also result in the end surface of the conductors 104, 106 and 108, that is surfaces such as that at 135 on the conductor 104, being roughened and provided with surface voids which will be filled and form interconnections during the deposition of the metal 114. These additional roughened surfaces and mating through-hole conductor surfaces of course provide improved electrical conductivity between the conductors 104, 106 and 108 and the through-hole conductor 103, as well as improving the mechanical rigidity between the conductors 104 and 103. Roughening or texturing of these end surfaces will also occur to some degree during the drilling or other operation by which perforation of the wiring board is achieved.

Numerous other variations of the invention are possible, one such variation for example, would eliminate the center conductor 106, thereby providing a two-faced printed wiring board of the type most popularly used in present-day electronic systems. Another variation would include the presence of insulating layers on the exterior of the outermost conductors 104 and 108. Another variation of the invention might include a selective interconnection of printed wiring board conductor layers with certain of the layers being excluded from the interconnection, as could be arranged, for example, if the conductor 106 were terminated short of the conductor 103 or shortened following perforation of the laminate structure and suitably protected from the depositing of material during the formation of the through-hole conductor 103.

Another variation of the invention might employ an inorganic insulating material at 110 and 112 such as a ceramic, mica, or glass material in combination with a high-temperature fusing between the conductor and insulation layer materials or with the use of an adhesive between the inorganic insulator and the conductor surfaces.

The described plated through-hole conductor arrangement affords greater immunity to the temperature variations expected during manufacture and use of a printed wiring board, that is, to the temperature of a component soldering operation and the large temperature environmental changes expected in military equipment, while also providing improved resistance to vibration and other mechanical stresses encountered by in-the-field electronic equipment.

While the apparatus and method herein described constitute a preferred embodiment of the invention, it is to be understood that the invention is not limited to this precise form of apparatus or method, and that changes may be made therein without departing from the scope of the invention, which is described in the appended claims.

I claim:

1. The method of forming soldering temperature resistant layer interconnecting through conductors in a printed wiring board having alternating layers of conductor material that are separated by insulating material comprising the steps of:

drilling holes through said alternating layer printed wiring board at through conductor locations thereof;

enlarging the diameter of said holes at the insulating layer hole depths thereof until regions of exposed conductor layer opening into said holes are formed;

roughening hole residing conductor surface areas in said exposed conductor layer region, said roughening including forming U-shaped cross section voids of depth and width at least one-tenth the conductor thickness on each said conductor lateral surface; and filling said holes and said enlarged diameter regions at least partially be depositing therein additional conductive material, said conductive material also physically engaging portions of said roughened conductor surface area and said voids therein in temperature cycling resistant mechanical interlocking low electrical resistance continuity therewith.

2. A method for providing thermal cycling resistant electrical interconnection for the insulating layer segregated planar conductors in a three or more metal conductor layered printed circuit board comprising the steps of:

roughening the inward facing lateral surfaces of the unassembled external conductors and both lateral surfaces of the unassembled internal layer conductors, surrounding the interconnecting points thereof, said roughening displacing metal from conductor lateral surfaces surrounding the interconnecting points in a pattern of U-shaped cross section void of depth and width at least one-tenth the conductor thickness on each conductor lateral surface;

assembling the conductor and insulating layer members into an alternating layer laminate sandwich having the conductor roughened lateral surface areas in axially aligned condition;

drilling holes through the axially aligned roughened lateral surface area surrounded interconnection points of the assembled conductor and insulating layer sandwich;

enlarging the drilled holes in the insulating layer members to a diameter exposing predetermined of the conductor lateral surface displaced metal voids surrounding the drilled holes; and depositing through-conductor metal within the drilled holes into intimate overlapping mechanical engagement with the displaced metal voids;

whereby thermal cycling resistant mechanical interlocking obtains between through conductor deposited metal and the void roughened lateral surfaces.

* * * * *

UNITED STATES PATENT AND TRADEMARK OFFICE
CERTIFICATE OF CORRECTION

PATENT NO. : 4,628,598

DATED : December 16, 1986

INVENTOR(S) : Edward Taylor

It is certified that error appears in the above-identified patent and that said Letters Patent is hereby corrected as shown below:

Column 3, line 23, the word --dimension-- should follow "similar".

Column 3, line 35, the words "lower" and "exterior" are transposed.

Column 3, line 40, "surfaces exist" should read --surfaces are indicated--.

Column 3, line 68, "fabricated" should read --fashioned--.

Column 5, line 17, the words "are" and "classified" are transposed.

Column 5, line 29, "wherein the case" should read --in the case where--.

Column 5, line 33, "formed" should read --achieved--.

Column 5, line 34, "achieved" should read --formed--.

Column 7, line 12 (claim 1), "be" should read --by--.

Column 8, line 5 (claim 2), "void" should read --voids--.

Signed and Sealed this

Twenty-first Day of April, 1987

Attest:

DONALD J. QUIGG

Attesting Officer

Commissioner of Patents and Trademarks